United States Patent
Feurle et al.

(10) Patent No.: US 6,492,729 B1
(45) Date of Patent: Dec. 10, 2002

(54) CONFIGURATION AND METHOD FOR CONNECTING CONDUCTOR TRACKS

(75) Inventors: Robert Feurle, Neubiberg (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 09/685,659

(22) Filed: Oct. 10, 2000

(30) Foreign Application Priority Data

Oct. 8, 1999 (DE) .......................................... 199 48 570

(51) Int. Cl.$^7$ .............................................. H01L 23/48
(52) U.S. Cl. ........................ 257/754; 257/758; 257/773
(58) Field of Search ................................. 257/754, 758, 257/762, 763, 928, 773, 776; 748/DIG. 39; 438/621

(56) References Cited

U.S. PATENT DOCUMENTS

| | | | | |
|---|---|---|---|---|
| 4,333,099 A | * | 6/1982 | Tanguay et al. | 257/928 |
| 5,190,893 A | * | 3/1993 | Jones, Jr. et al. | 438/621 |
| 5,670,424 A | * | 9/1997 | Chan et al. | 438/621 |
| 6,258,647 B1 | * | 7/2001 | Lee et al. | 438/233 |

FOREIGN PATENT DOCUMENTS

EP   0 535 229 A1   4/1993

OTHER PUBLICATIONS

Wolf, S., Silicon Processing for the VLSI Era, vol. 2, Lattice Press, 1990, pp. 186–194.*

* cited by examiner

*Primary Examiner*—T. N. Quach
(74) *Attorney, Agent, or Firm*—Laurence A. Greenberg; Werner H. Stemer; Gregory L. Mayback

(57) ABSTRACT

A configuration for connecting conductor tracks includes a first conductor track fabricated with a first phase mask having a first phase and a second conductor track fabricated with a second phase mask having a second phase opposite to the first phase. The first and second conductor tracks define a given metallization plane and are disposed on this given metallization plane. The first conductor track adjoins the second conductor track in a junction region such that a discontinuity is provided between the first conductor track and the second conductor track. A connecting contact is disposed above or below the given metallization plane and connects the conductor tracks in the junction region. Moving the connection above or below the metallization plane avoids phase conflicts in the junction region. A method of electrically connecting conductor tracks is also provided.

16 Claims, 2 Drawing Sheets

CONFIGURATION AND METHOD FOR CONNECTING CONDUCTOR TRACKS

BACKGROUND OF THE INVENTION

FIELD OF THE INVENTION

The invention relates to a configuration and a method for connecting conductor tracks produced with phase masks.

Phase masks are commonly used for the superfine structuring of conductor tracks. In the exposure process phase masks utilize polarized light which is phase-shifted by 180° for respectively adjacent conductor tracks. For example, light with a polarization angle of 0° is employed in the structuring of a first conductor track, whereas light with the polarization angle of 180° is used for a conductor track that is adjacent to this first conductor track. These alternating phases that have a phase shift with respect to one another make it possible to generate structures with substantially vertical sidewalls and in particular to prevent undesired irregular structures or "concretions" at the sidewalls. The phase shift is realized by a mask configuration which brings about different phase shifts in the incoming coherent light for adjacent lines or conductor tracks.

The use of phase masks remains unproblematic as long as conductor tracks which are structured by exposure to light of different phases do not abut or adjoin one another. Problems arise when the conductor tracks adjoin one another. To realize a phase rotation, the phase mask is etched to different depths in different phase regions. The remaining differing residual glass thickness of the phase mask then causes the phase shift or phase rotation. When two lines which have different phases due to their adjacency touch one another, then a phase jump, that is to say, a phase conflict, emerges at this location. The adjoining exposure regions of different polarity generate a destructive interference at their transition. The result of this is that an unexposed region forms at the point of contact. This causes tears or interruptions in the conductor tracks, which destroy the chip function of the circuit that is realized with the conductor tracks.

An example of this is given in FIG. 6, which shows a plan view of a configuration with conductor tracks 1, 2, 2', 3, 3', and 4 on a semiconductor body 5. The conductor tracks 1 and 4 are configured in continuous form here, whereas the conductor track 2 and the conductor track 3' form a "twist", and the conductor tracks 2' and 3 can be connected to each other on a further level which is not shown. As explained above, with a phase mask adjacent conductor tracks are formed by a structuring process which uses an exposure to light of alternating phases. That is, the conductor tracks 1, 3 and 3' are structured by exposure to light with the phase of 0°, while the conductor tracks 2, 2' and 4 are structured by exposure to light of the phase of 180°. In this case a phase conflict arises at the twist or in a region of the intersection of the conductor tracks, as is indicated by a dotted line 6. Such phase conflicts are extremely undesirable and should be avoided if possible.

In order to preclude phase conflicts, it has been suggested to use what are known as "multiphase masks", although it has not been possible to manufacture these economically. Therefore, in practice another approach has been taken, in which the connection between the conductor track 2 and the conductor track 3' is sunk down or elevated up to another lithography level. But this type of procedure is relatively complicated, since it requires an additional exposure process for these additional lithography levels, which raises the cost of the structuring process for the conductor tracks significantly.

No other solutions for the above-described problem are known yet.

SUMMARY OF THE INVENTION

It is accordingly an object of the invention to provide a configuration and a method for connecting conductor tracks which overcome the above-mentioned disadvantages of the heretofore-known configurations and methods of this general type and which avoid in a simple manner phase conflicts when phase masks are used.

With the foregoing and other objects in view there is provided, in accordance with the invention, a configuration for connecting conductor tracks, including:

a first conductor track fabricated with a first phase mask having a first phase;

a second conductor track fabricated with a second phase mask having a second phase opposite to the first phase;

the first and second conductor tracks define a given metallization plane and are disposed on the given metallization plane;

the first conductor track adjoining the second conductor track in a junction region such that a discontinuity is provided between the first conductor track and the second conductor track; and a connecting contact disposed above or below the given metallization plane and connecting, in the junction region, the first conductor track to the second conductor track.

In other words, the object of the invention is achieved with a configuration which is fabricated using phase masks with alternating phases on a predetermined metallization level in such a way that a first conductor track, which is fabricated using a phase mask of a first phase, adjoins a second conductor track, which is created using a phase mask of a second, opposite phase, so that a discontinuity in the circuit that is formed by the first and second conductor tracks can be brought about at the junction between the first and second conductor tracks. The connection between the first conductor track and the second conductor track is accomplished by a connecting contact that is introduced beneath or above the predetermined metallization level. This connecting contact can be a doped polycrystalline silicon that is deposited in the region of the phase conflict with the aid of a preceding mask that is used anyway. The doped silicon later provides the connection between the first and second conductor tracks. The region between the first and second conductor tracks can additionally be filled with metal as well.

In accordance with another feature of the invention, the connecting contact is a doped polycrystalline silicon contact.

In accordance with yet another feature of the invention, the junction region is formed with a space between the first and second conductors; and the connecting contact fills out the space between the first and second conductor tracks.

In accordance with a further feature of the invention, a metal fills out the space between the first and second conductor tracks. The metal is preferably aluminum, tungsten or copper.

With the objects of the invention in view there is also provided, a method of electrically connecting conductor tracks, which includes the steps of:

providing a base layer defining a metallization plane;

producing a first conductor track on the metallization plane by exposing a first phase mask with light having a first phase;

producing a second conductor track on the metallization plane by exposing a second phase mask with light having a second phase opposite to the first phase;

providing a discontinuity between the first conductor track and the second conductor track in a junction region of the first and second conductor tracks; and electrically connecting the first conductor track to the second conductor track by producing a connecting contact above or below the given metallization plane in the junction region.

The invention thus takes a completely different approach than the prior art. Instead of the conventional double exposure with the aid of an additional lithography level, the connection in the region of the phase conflict between the first and second conductor tracks is moved to another mask which is already present, so that the phase conflict that is to say, the problem caused thereby is totally eliminated. A suitable structure in the form of the connecting contact is deposited in advance, for instance at crossings, with the aid of an already existing mask. Conductor tracks that are structured by exposure to light of different phases can then be connected to each other without problems via this connecting contact.

Other features which are considered as characteristic for the invention are set forth in the appended claims.

Although the invention is illustrated and described herein as embodied in a configuration and a method of connecting conductor tracks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
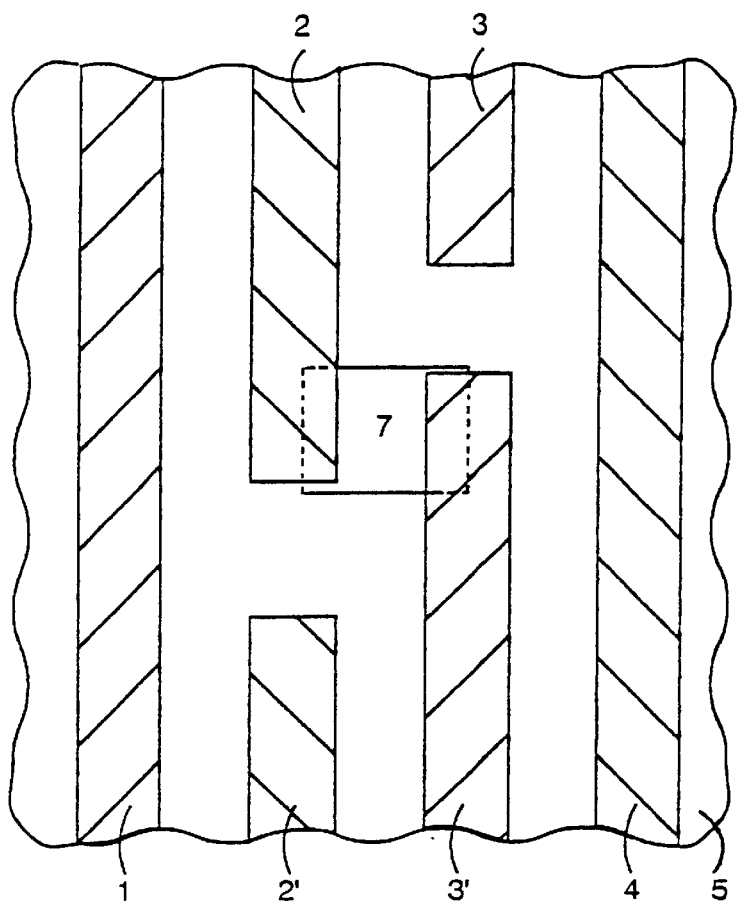
FIG. 1 is a diagrammatic plan view of a configuration according to the invention.
Figure 5:
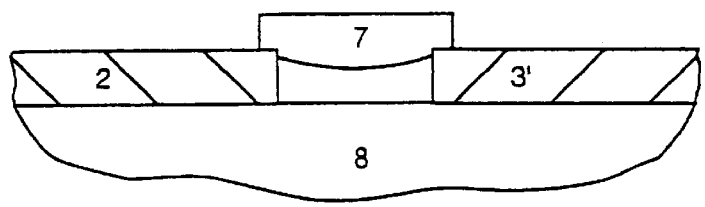
Figure 6:
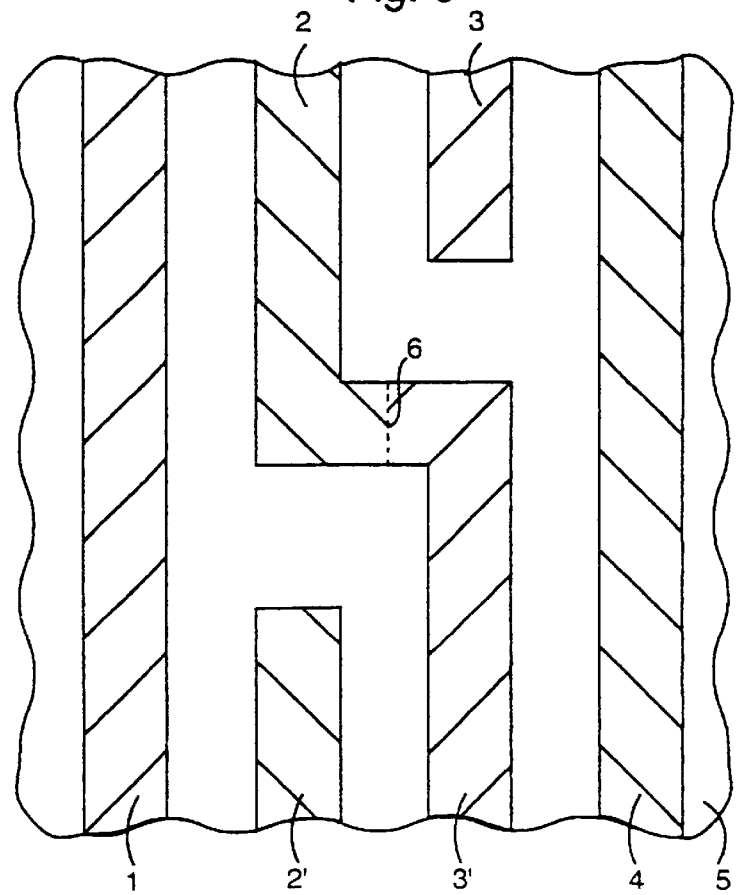
FIG. 6 is a diagrammatic plan view of a conventional configuration for wiring conductor tracks.

Referring now to the figures of the drawings in detail and first, particularly, to FIG. 1 thereof, there are shown conductor tracks 1, 2, 2', 3, 3' and 4 on a semiconductor body 5, wherein the conductor tracks 1, 3 and 3' —as in the conventional example as shown in FIG. 6—are structured by exposure to light having a phase angle of 0°, and the conductor tracks 2, 2' and 4—as in the configuration of FIG. 6—are structured by exposure to light having a phase angle of 180°. In FIGS. 1 to 5 components that correspond to those in FIG. 6, which has already been described above, are assigned the same reference characters. A phase conflict such as would usually arise at the junction or connecting region between the conductor tracks 2 and 3' (which is indicated by the dotted line 6 in FIG. 6) is prevented in accordance with the invention in that the conductor tracks 2 and 3' are connected to each other in this case by a connecting contact 7 which has been previously inserted in a region beneath the metallization plane or metallization level formed by the conductor tracks 1, 2, 2', 3, 3' and 4.

Figure 2:
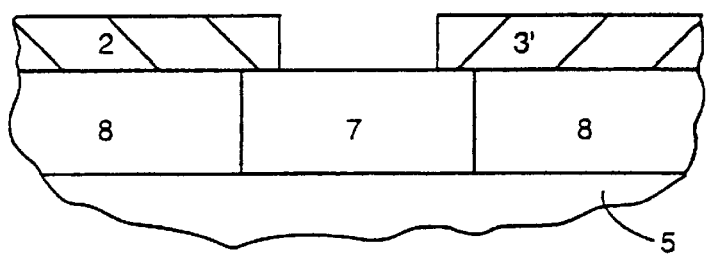
FIGS. 2 to 5 are diagrammatic, partial sectional views of various embodiments for a junction between a first conductor track and a second conductor track.
Figure 3:
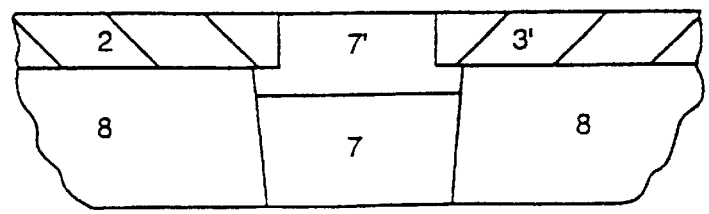
Figure 4:
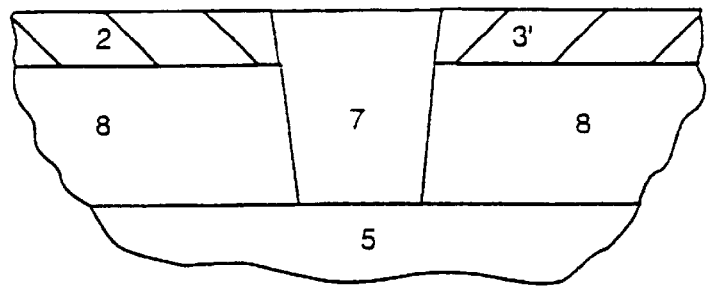

FIGS. 2 to 5 illustrate various possibilities for realizing this connecting contact 7. Namely, as illustrated in FIG. 2, the connecting contact can be composed of polycrystalline silicon that is embedded in a silicon dioxide layer 8 on a silicon semiconductor body 5 and that thereby provides for an electrical connection between the conductor tracks 2 and 3'. A phase mask 10 is schematically indicated by a dashed line in FIG. 2. Another variant is illustrated in FIG. 3, in which the region between the conductor tracks 2, 3' is additionally filled with metal 7' such as aluminum or tungsten or copper. In this exemplary embodiment, the metal 7' provides the electrical connection between the conductor tracks 2 and 3'. FIG. 4 shows an exemplary embodiment in which the polycrystalline silicon connecting contact 7 extends up to an upper edge of the conductor tracks 2 and 3'. FIG. 5 shows an exemplary embodiment in which the connecting contact 7 is realized on a contact level that lies above the level of the conductor tracks 2, 3'.

Of course, other materials besides polycrystalline silicon can be used for the connecting contact, such as aluminum, tungsten, or copper.

Furthermore, it is not absolutely necessary for the connecting contact 7 to be disposed only one metallization level beneath the metallization level formed by the conductor tracks 1, 2, 2', 3, 3' and 4. This connecting bridge may also be deposited two or more levels below or above the metallization level of the conductor tracks. It is also possible to insert the connecting contact 7 in the form of polycrystalline silicon in a recess of an insulator layer, such as a silicon dioxide layer.

We claim:

1. A configuration for connecting conductor tracks, comprising:

a first conductor track fabricated with a first phase mask having a first phase;

a second conductor track fabricated with a second phase mask having a second phase opposite to the first phase;

said first and second conductor tracks define a given metallization plane and are disposed on the given metallization plane and disposed to extend parallel to each other with a space therebetween;

said first conductor track adjoining said second conductor track in a junction region such that a discontinuity is provided between said first conductor track and said second conductor track; and a connecting contact disposed above said given metallization plane and connecting, in said junction region, said first conductor track to said second conductor track.

2. The configuration according to claim 1, wherein said connecting contact is a doped polycrystalline silicon contact.

3. The configuration according to claim 2, wherein:

said junction region is formed with a space between said first and second conductors; and said connecting contact fills out said space between said first and second conductor tracks.

4. The configuration according to claim 2, wherein said junction region is formed with a space between said first and second conductors; and a metal fills out said space between said first and second conductor tracks.

5. The configuration according to claim 4, wherein said metal is selected from the group consisting of aluminum, tungsten and copper.

6. The configuration according to claim 1, wherein:

said junction region is formed with a space between said first and second conductors; and said connecting contact fills out said space between said first and second conductor tracks.

7. The configuration according to claim 1, wherein said junction region is formed with a space between said first and second conductors; and a metal fills out said space between said first and second conductor tracks.

8. The configuration according to claim 7, wherein said metal is selected from the group consisting of aluminum, tungsten and copper.

9. A configuration for connecting conductor tracks, comprising:

a first conductor track fabricated with a first phase mask having a first phase;

a second conductor track fabricated with a second phase mask having a second phase opposite to the first phase;

said first and second conductor tracks define a given metallization plane and are disposed on the given metallization plane and disposed to extend parallel to each other with a space therebetween;

said first conductor track adjoining said second conductor track in a junction region such that a discontinuity is provided between said first conductor track and said second conductor track; and a connecting contact disposed below said given metallization plane and connecting, in said junction region, said first conductor track to said second conductor track.

10. The configuration according to claim 9, wherein said connecting contact is a doped polycrystalline silicon contact.

11. The configuration according to claim 10, wherein:

said junction region is formed with a space between said first and second conductors; and said connecting contact fills out said space between said first and second conductor tracks.

12. The configuration according to claim 10, wherein said junction region is formed with a space between said first and second conductors; and a metal fills out said space between said first and second conductor tracks.

13. The configuration according to claim 12, wherein said metal is selected from the group consisting of aluminum, tungsten and copper.

14. The configuration according to claim 9, wherein:

said junction region is formed with a space between said first and second conductors; and said connecting contact fills out said space between said first and second conductor tracks.

15. The configuration according to claim 9, wherein said junction region is formed with a space between said first and second conductors; and a metal fills out said space between said first and second conductor tracks.

16. The configuration according to claim 15, wherein said metal is selected from the group consisting of aluminum, tungsten and copper.

* * * * *